US006906606B2

(12) United States Patent  (10) Patent No.: US 6,906,606 B2
Jacobs  (45) Date of Patent: Jun. 14, 2005

(54) MAGNETIC MATERIALS, PASSIVE SHIMS AND MAGNETIC RESONANCE IMAGING SYSTEMS

(75) Inventor: Israel Samson Jacobs, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/682,114

(22) Filed: Oct. 10, 2003

(65) Prior Publication Data

US 2005/0077899 A1 Apr. 14, 2005

(51) Int. Cl.$^7$ .............................. H01F 1/00; G01V 3/00
(52) U.S. Cl. ...................................... 335/296; 324/319
(58) Field of Search ............................... 335/296, 297, 335/217, 219, 302; 148/100, 101, 105, 511; 324/319, 320

(56) References Cited

U.S. PATENT DOCUMENTS

| | | | |
|---|---|---|---|
| 1,724,405 A | 8/1929 | Knight | |
| 2,213,085 A | 8/1940 | Faus | |
| 2,968,548 A | 1/1961 | Clark | |
| 4,456,898 A | 6/1984 | Frischmann | 335/217 |
| 5,349,297 A | 9/1994 | DeMeester et al. | 324/318 |
| 5,478,411 A * | 12/1995 | Coey et al. | 148/122 |
| 5,677,854 A | 10/1997 | Dorri | 364/578 |
| 6,294,972 B1 | 9/2001 | Jesmanowicz et al. | 335/301 |
| 6,803,761 B2 * | 10/2004 | Prammer et al. | 324/303 |

OTHER PUBLICATIONS

Charles Kittel, "Introduction to Solid State Physics". John Wiley & Sons, Inc. NY (1953), pp. 164. (For figure 1.).
W.P. Wolf, "Ferrimagnetism", in Reports of Progress in Physics, vol. 24, (1961) pp. 212–303. (For figure 2, a, b, c and d.).
J. Laforest, R. Lemaire, R. Pauthenet and J. Schweizer, Comptes Rendus Acad. Sci. Paris[Ser. B.], vol. 262, p. 1260 (1966), "Propriete magnetostaliques des alliages T(2)Co(17) dans lesquels T est un metal des terres rares ou l'yttrium". (Figures 3a and b.).
K.H.J. Buschow, Physica Status Solidi, vol., (a)7, pp. 199–210 (1971), "Intermetallic Compounds of Rare Earth Elements and Ni, Co or Fe". (Figure 4.).
E. Burzo, Zeits. f. Angewandte Physik, vol. 32, pp. 127–132 (1971), "Magnetic and Crystallographic Properties of Rare Earth and Yttrium–Iron Laves Phases". (Figure 5.).
J.E. Greedan, Amer. Inst. of Physics Conference aproceedings, No. 5, Part 2, (1972), pp. 1325–1429 [Proc. Conf. on magnetism and magnetic materials–1971], "Magnetic Properties of gd(1–x) Th(x) Fe(3)". (Figure 6.).
E.W. Gorter and J.A. Schulkes, Phy. Rev., vol. 90, pp. 487–488 (1953), "Reversal of Spontaneous Magnetization as a Function of Temperature in LiFe O Spinels". (Figure 7.).
F. Bertaut and R. Pauthenet, Proc. IEEE, vol. B104, Supplements Nos. 5–7, pp. 261–264 (1957), "Crystalline Structure and Magnetic Properties of Ferrites Having the General Formula 5Fe(2)O(3).3MeO(3)". (Figure 8A).
A. Budkowski, A. Szytula, D. Rodic, R. Duraj, J. Mayer, J. Sciesinski and V. Spasojevic, j. Magnetism and Magnetic Materials, vol. 78, pp. 226–236, (1989), "The Compensation Point in REIG and Some of its Properties". (Figure 8B.).
P. Hansen, K. Witter and W. Talksdorf, Phys. Rev. B, vol. 27, pp. 4375–4383 (1983), "Magnetic and Magneto–Optical Properties of Bismuth–Substituted Gadolinium–Iron Garnet Films". Note: The data for T<T (comp) apply to the left hand scale and those for T>T.

* cited by examiner

*Primary Examiner*—Louis Arana
(74) *Attorney, Agent, or Firm*—Jean K. Testa; Patrick K. Patnode

(57) ABSTRACT

A shim adapted for altering a magnetic field of a magnet includes a first material which exhibits an increase in spontaneous magnetization with an increase in temperature for a predetermined temperature range.

40 Claims, 9 Drawing Sheets

○ ErFe$_2$
TmFe$_2$

I = Magnetization
II = Remanence

MAGNETIC MATERIALS, PASSIVE SHIMS AND MAGNETIC RESONANCE IMAGING SYSTEMS

BACKGROUND OF THE INVENTION

The present invention relates to magnetic materials. In particular, the invention relates to magnetic materials used in magnetic resonance imaging system shims.

Magnetic Resonance Imaging (MRI) systems typically include a superconducting magnet which generates a primary magnetic field within an imaging volume. Inhomogeneities in the primary magnetic field are a result of manufacturing tolerances for the magnet, and equipment and site conditions. Magnetic field inhomogeneities distort the position information in the imaging volume and degrade the image quality. The imaging volume must have a low magnetic field inhomogeneity for high quality imaging. Shimming is a known technique for reducing the inhomogeneity of the primary magnetic field. The primary magnetic field can be pictured as a large constant field with small inhomogeneous field components superimposed on the constant field. If the negative of the inhomogeneous components of the field can be generated, the net field will be made uniform and the magnet is then said to be shimmed.

It is known to use active or passive shims for reducing the magnetic field inhomogeneity. Active shimming is accomplished using resistive shim coils to generate magnetic fields designed to cancel out the inhomogeneous field components. Passive shimming is accomplished using shims comprised of ferromagnetic materials such as carbon steel. A magnetic field arising from an induced magnetic dipole of the shim is used to cancel out the inhomogeneous field components. The number, mass, and position of the shims are determined by known shimming techniques. The shims are contained in a shim assembly located near a gradient coil structure that generates the x, y, and z gradient magnetic fields used for MRI. The shim assembly is in thermal contact with the outer section of the gradient coil structure. Pulsing the gradient coils results in heat generation due to joule losses. A portion of the heat generated is transferred to the shim assembly causing an increase in the temperature of the shims. The higher temperature reduces the magnetization of the shim material, and weakens the magnetic field the shims produce. This results in an increase in the magnetic field inhomogeneity.

The concept of reduction of the magnetic field produced by a ferromagnetic shim element with increasing temperature is illustrated in FIG. 1 and table I below. A ferromagnetic material has a spontaneous magnetic moment and a magnetization which is defined as the magnetic moment per unit volume. The magnetic moments in a ferromagnetic material are aligned in the same direction. Above a temperature called the Curie temperature ($T_c$), spontaneous magnetic moments and magnetization vanish. FIG. 1 shows the change in a relative magnetization of nickel as a function of temperature. Relative magnetization is shown as the ratio of the magnetization at a temperature, T to the magnetization at about 0 K. The horizontal axis represents the ratio of the temperature, T to the Curie temperature, $T_c$. As the temperature increases, the magnetization decreases until it vanishes at the Curie temperature. Examples of ferromagnetic materials other than nickel include iron, cobalt, iron alloys, cobalt alloys, nickel alloys, and intermetallic compounds such as MnAs and MnBi. Table 1 lists the magnetization at or near room temperature and at about 0 K. As can be seen from Table 1, the value for magnetization at or near room temperature is lower than that at about 0 K.

TABLE 1

| Material | $B_i/4\pi$ @ room temperature, Gauss | $B_i/4\pi$ @ 0 K, Gauss |
|---|---|---|
| Fe | 1707 | 1740 |
| Co | 1400 | 1446 |
| Ni | 485 | 510 |
| MnAs | 670 | 870 |
| MnBi | 620 | 680 |

BRIEF SUMMARY OF THE INVENTION

In one embodiment of the invention, a shim adapted for altering a magnetic field of a magnet comprises a first material which exhibits an increase in spontaneous magnetization with an increase in temperature for a predetermined temperature range.

In still another embodiment of the invention, a method for altering a magnetic field of a magnet comprises disposing a shim within said magnetic field, wherein the shim comprises a first material which exhibits an increase in spontaneous magnetization with an increase in temperature for a predetermined temperature range.

In still another embodiment of the invention, a magnetic resonance imaging system comprises a primary magnet and a shim assembly. The shim assembly is capable of altering a magnetic field generated by the primary magnet. The shim assembly comprises a ferromagnetic material and a ferrimagnetic material which exhibits an increase in spontaneous magnetization with an increase in temperature for a predetermined temperature range.

In still another embodiment of the invention, a magnet comprises a ferromagnetic material and a ferrimagnetic material which exhibits an increase in spontaneous magnetization with an increase in temperature for a predetermined temperature range.

DETAILED DESCRIPTION OF THE INVENTION

The present inventor has realized that a shim may comprise a material which exhibits an increase in spontaneous magnetization with increasing temperature (i.e., $dM_s/dT>0$) for a predetermined temperature range. This material may be used to eliminate or reduce the decrease in magnetization of the shim with increasing temperature and the resulting inhomogeneity of the magnetic field of the magnet.

While ferromagnetic materials exhibit a negative change in magnetization with respect to temperature, there exist certain materials that exhibit a positive change in spontaneous magnetization with respect to temperature under certain conditions. In one embodiment of the invention, the shim comprises a magnetic material that is capable of exhibiting a positive change in spontaneous magnetization with temperature in a predetermined temperature range, wherein the magnetic material is capable of altering a magnetic field.

Preferably, the shim comprises one or more ferrimagnetic materials which exhibit a positive change in spontaneous magnetization with respect to temperature in a certain temperature range. These materials preferably comprise metal alloys or intermetallic materials which exhibit a positive change in spontaneous magnetization with respect to temperature in a certain temperature range. Alternatively, the shim comprises ceramic materials which exhibit a positive change in spontaneous magnetization with respect to temperature in a certain temperature range.

In one aspect of the present invention, the shim may consist of only the material which exhibits a positive change in spontaneous magnetization with respect to temperature in a certain temperature range. The shim is designed such that a negative change in magnetization with temperature in the magnet is offset by a positive change in magnetization in the shim material over the desired magnet and shim operating temperature range.

In another aspect of the present invention, the shim comprises a combination of a ferromagnetic material and a material which exhibits a positive change in spontaneous magnetization with respect to temperature, such as a ferrimagnetic intermetallic or ceramic material. The shim is designed such that a negative change in magnetization with temperature in the ferromagnetic material is offset by a positive change in magnetization in the ferrimagnetic material over the desired operating temperature range. By adjusting the type and proportion of the ferromagnetic material and the ferrimagnetic $dM_s/dT>0$ material, the change in magnetization of the shim and/or of the magnet with temperature is altered to the extent desired. Preferably, the shim comprises 50 to 95, preferably 80 to 90 volume percent ferromagnetic material and 5 to 50, preferably 10 to 20 volume percent of the ferrimagnetic material which exhibits $dM_s/dT>0$.

Figure 1:
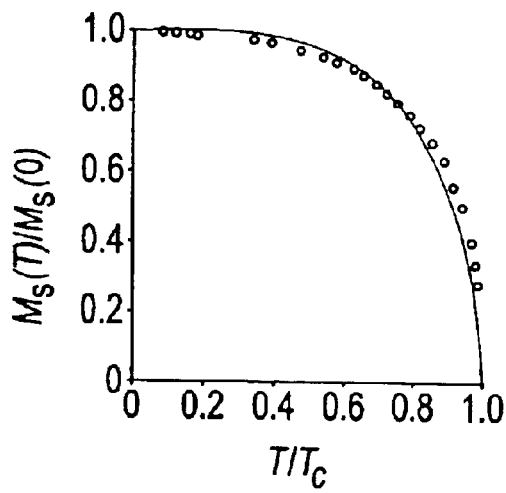
FIG. 1 shows the magnetization of nickel as a function of temperature together with the theoretical curve.
Figure 2A:
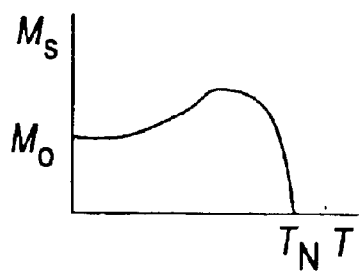
FIGS. 2A, 2B, 2C and 2D show the magnetization of various ferrimagnetic materials of alternative embodiments of the present invention as a function of temperature.
Figure 2B:
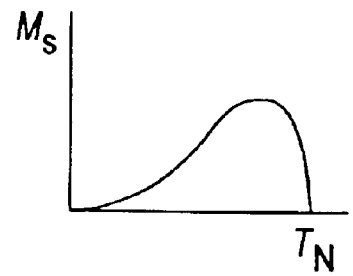
Figure 2C:
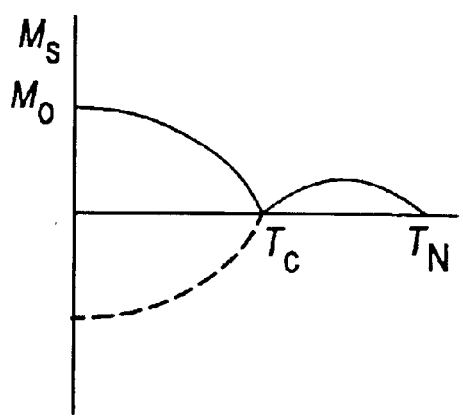
Figure 2D:
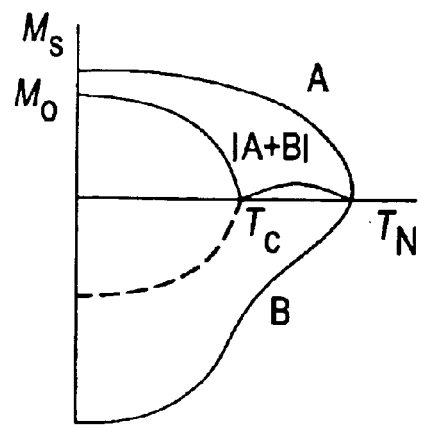

FIGS. 2a, 2b, 2c, and 2d illustrate the different types of relationships between spontaneous magnetization and temperature that have been observed for various shim materials which exhibit $dM_s/dT>0$. In FIG. 2a, the material exhibits magnetization that increases to a maximum value at a certain temperature and then decreases to zero with increasing temperature up to $T_N$. FIG. 2b illustrates the variation of spontaneous magnetization with temperature in materials wherein the magnetization is close to zero at 0 K. FIG. 2c depicts the variation of spontaneous magnetization with temperature in materials that exhibit a compensation point at temperature, $T_c$, at which the magnetization goes to zero. Below this temperature, the material exhibits a negative change in magnetization with respect to temperature. Above this temperature, the material exhibits a positive change in magnetization with respect to temperature for a given temperature range. FIG. 2d illustrates the origin of a compensation point at $T_c$ arising from cancellation of two sublattice magnetizations, A and B. Any one or more suitable materials which exhibit the $dM_s/dT>0$ property over a given temperature range may be used in a shim. Preferably, the shim contains a material whose spontaneous magnetization increases by at least 25%, preferably by at least 50%, most preferably by at least 100% with increasing temperature.

In a first embodiment, intermetallic ferrimagnetic materials of rare earth elements (R) with 3d transition elements (M) such as iron, nickel, and cobalt, and which show a positive change in magnetization with temperature, are used in a shim. Intermetallic compounds exhibit a number of distinct yet related crystal structures. Examples of intermetallic compounds include compounds with the formulae $RM_2$, $RM_3$, $R_2M_7$, $R_6M_{23}$, $RM_{5+x}$, and $R_2M_{17}$. The magnetic properties of these compounds depend on the relative strength and sign of the interatomic magnetic exchange couplings, i.e., the R—R coupling, the M—M coupling, and the R-M coupling. For the heavy rare earth elements, Gd and beyond, the R-M coupling is antiferromagnetic which leads in general to a positive change in magnetization with increasing temperature.

In one preferred aspect of the first embodiment, the shim comprises a $R_2M_{17}$ intermetallic ferrimagnetic material, where R comprises at least 90 weight percent, and preferably about 100 weight percent of at least one rare earth element and M comprises 90 to 100 weight percent Co. The rare earth element preferably comprises Sm, Tm, Er, Ho, Dy, Tb or Gd. A small amount of other transition metal elements and unavoidable impurities, such as Ni or Fe may be substituted for Co. Preferably, the material comprises $Dy_2Co_{17}$, whose magnetization increases by about 175% (i.e., 2.75 times) with increasing temperature.

Figure 3A:
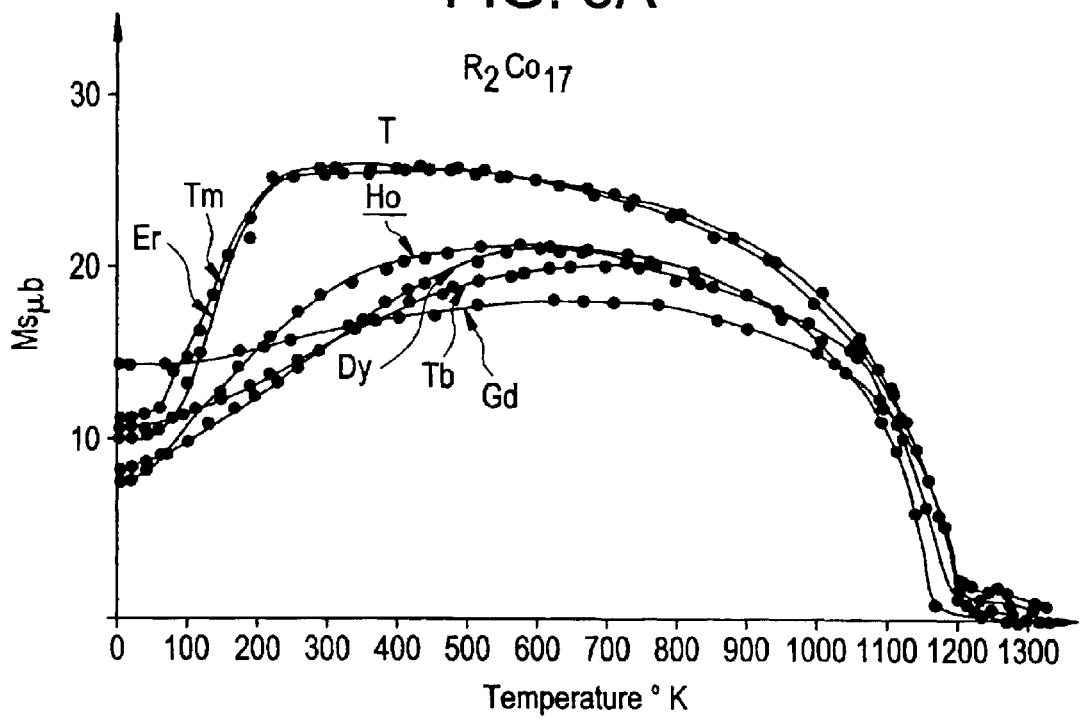
FIGS. 3A and 3B show the magnetization as a function of temperature for various $R_2Co_{17}$ materials in accordance with one embodiment of the invention.
Figure 3B:
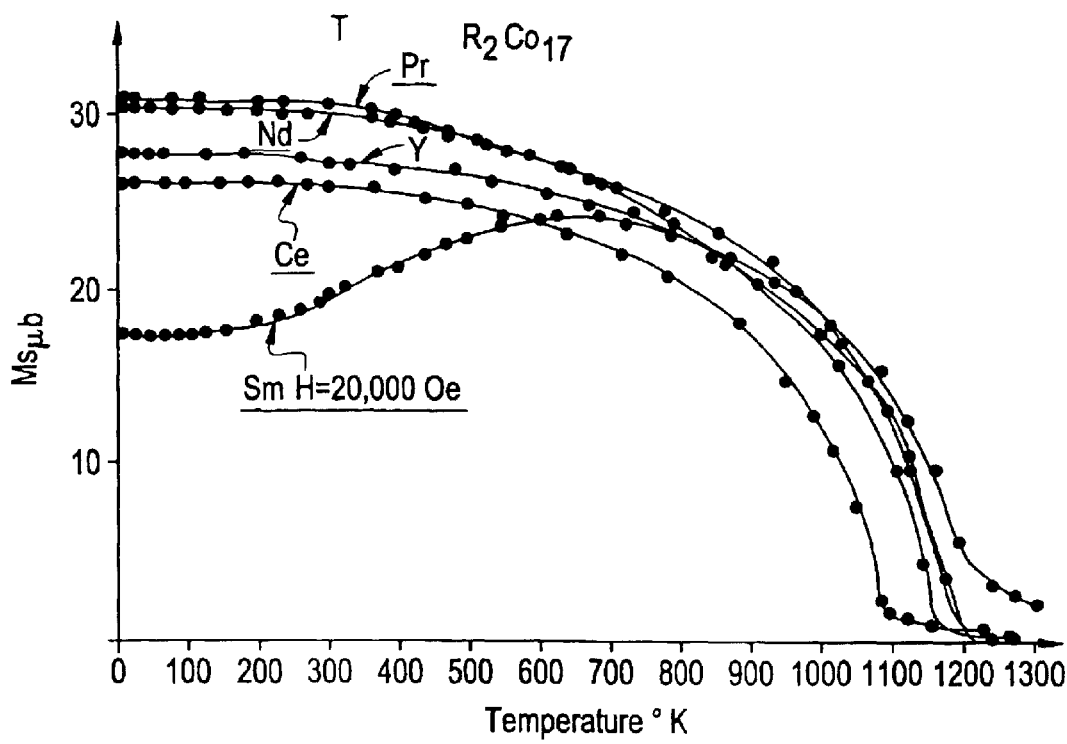

FIGS. 3a and 3b illustrate the magnetization behavior for eleven different $R_2Co_{17}$ intermetallic materials. The magnetization is represented in units of Bohr magnetons per formula unit, which comprises 19 atoms. Several of the materials demonstrate a positive rate of change in spontaneous magnetization with respect to temperature up to about 700 K. When R comprises Ho, Dy, Tb or Gd, then the $R_2Co_{17}$ intermetallic alloy exhibits a positive rate of change of magnetization in a temperature range from about 50K to about 600 K, as shown in FIG. 3a. When R comprises Tm or Er, then the $R_2Co_{17}$ intermetallic alloy exhibits a positive rate of change of magnetization in a temperature-range from about 50K to about 250 K, as shown in FIG. 3a. When R comprises Sm, then the $R_2Co_{17}$ intermetallic alloy exhibits a positive rate of change of magnetization in a temperature range from about 200K to about 700 K, as shown in FIG. 3b. However, when R comprises Y, Pr, Nd or Ce, then the $R_2Co_{17}$ intermetallic alloy does not exhibit a positive rate of change of magnetization. Of course, the $R_2Co_{17}$ intermetallic alloy may contain more than one rare earth element to adjust its rate of change of spontaneous magnetization with temperature to a desired value.

In another aspect of the first embodiment, the shim comprises a $RM_3$ or a $RM_2$ intermetallic ferrimagnetic material, where R comprises at least 90 weight percent, and preferably about 100 weight percent of at least one rare earth element and M comprises 90 to 100 weight percent of transition metal selected from Fe and Co. R preferably comprises Er, Ho or Gd for the $RM_3$ intermetallic compounds and Er or Tm for $RM_2$ intermetallic compounds, while M preferably comprises Fe.

Figure 4:
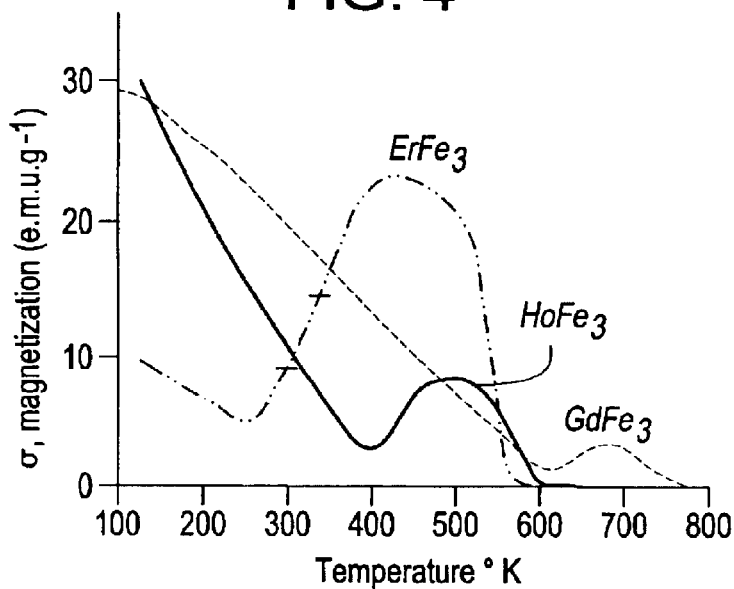
FIG. 4 shows the magnetization as a function of temperature for $ErFe_3$, $HoFe_3$, and $OdFe_3$ in accordance with one embodiment of the invention.
Figure 5:
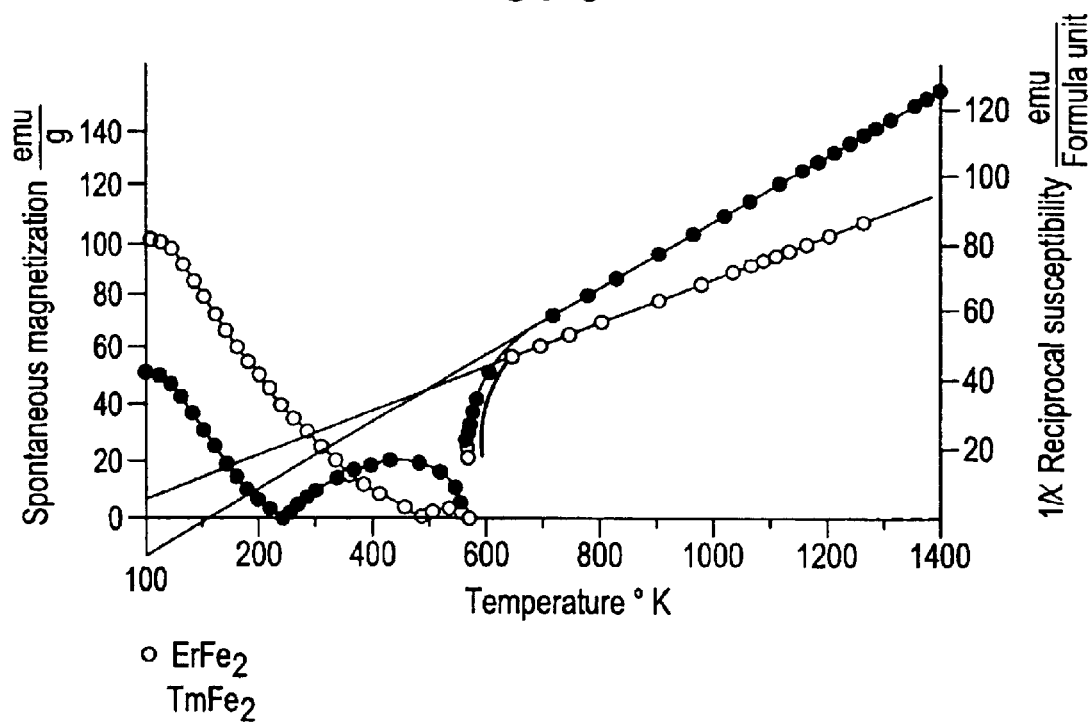
FIG. 5 shows the magnetization as a function of temperature for $ErFe_2$ and $TmFe_2$ in accordance with one embodiment of the invention.

FIGS. 4 and 5 show the variation in magnetization with temperature for $ErFe_3$, $HoFe_3$, $GdFe_3$, $ErFe_2$, and $TmFe_2$, which are examples of suitable intermetallic compounds. $ErFe_3$, $HoFe_3$ and $GdFe_3$ exhibit $dM_s/dT>0$ for temperature ranges of about 250 to about 400 K, about 400K to about 500K and about 620K to about 700K, respectively, as shown in FIG. 4. $TmFe_2$ exhibits $dM_s/dT>0$ for a temperature range of about 248 to about 500 K, while $ErFe_2$ exhibits a slight $dM_s/dT>0$ at a higher temperature. It is possible to alter the $dM_s/dT>0$ temperature range upward by using the rare earth element having a lower atomic number. For example, using Ho, which has a lower atomic number than Er increases the compensation temperature. If both Ho and Er are used in the $(Ho,Er)Fe_3$ compound, then the compensation temperature and the $dM_{sd}/dT>0$ range would be located between those of $ErFe_3$ and $HoFe_3$. Similarly, alloying with Er, which has a lower atomic number than Tm increases the compensation temperature for $TmFe_2$. Similarly, it is possible to alter the compensation temperature and the $dM_s/dt>0$ range downward by alloying the intermetallic compound with an element of the lanthanide rare earth series having a higher atomic number. For example, alloying with Ho, which has a higher atomic number than Gd decreases the compensation temperature for $GdFe_3$.

Table 2 lists several intermetallic compounds along with their compensation temperature. The selection of a particular intermetallic compound to offset a negative change in magnetization includes consideration of the compensation temperature (i.e., the lowest temperature above which $dM_s/dT>0$, which may be the compensation temperature, $T_c$, for some compounds where $M_s=0$).

TABLE 2

| Compound | Compensation Temperature (K) |
|---|---|
| $DyCo_3$ | 400 |
| $HoCo_3$ | 328 |
| $ErCo_3$ | 224 |
| $TmCo_3$ | 115 |
| $Gd_2Co_7$ | 428 |
| $Tb_2Co_7$ | 410 |
| $Dy_2Co_7$ | 380 |
| $Ho_2Co_7$ | 230 |
| $Er_2Co_7$ | 140 |
| $TbCo_{5.1}$ | ~110 |
| $DyCo_{5.2}$ | 93–170 |
| $HoCo_{5.5}$ | 71 |
| $ErFe_2$ | 485 |
| $TmFe_2$ | 251 |
| $YbFe_2$ | 31 |
| $GdFe_3$ | 618 |
| $TbFe_3$ | ~610 |
| $DyFe_3$ | 547 |
| $HoFe_3$ | 394 |
| $ErFe_3$ | ~236 |
| $Tb_6Fe_{23}$ | 280 |
| $Dy_6Fe_{23}$ | 272 |
| $Ho_6Fe_{23}$ | 205 |
| $Er_6Fe_{23}$ | 112 |

Figure 6:
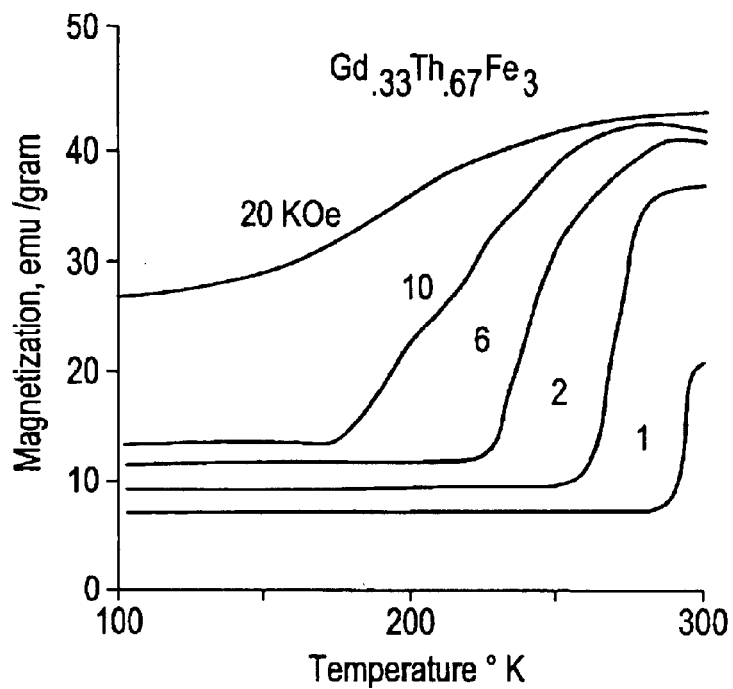
FIG. 6 shows the magnetization as a function of temperature for $Gd_{0.33}Th_{0.67}Fe_3$ in accordance with one embodiment of the invention.

Certain intermetallic compounds containing elements from the actinide rare-earth series alloyed with lanthanide rare-earth elements and 3d-transition metals also exhibit a positive change in magnetization with temperature. A suitable example is $Gd_{1-x}Th_xFe_3$ wherein x represents the atom fraction of thorium in the alloy. FIG. 6 illustrates the positive change in magnetization with temperature for the aforementioned intermetallic wherein x is equal to about 0.67. Similar behavior is also exhibited when the lanthanide member is Lu, Y, and Dy.

In a second embodiment of the present invention, the shim material which demonstrates the $dM_s/dT>0$ behavior is a ceramic (i.e., metal oxide) material. In one aspect of the second embodiment, the shim material is a spinel oxide compound having a formula $(A, D)_3E_4$, where A and D comprise different metal elements and E comprises 95 to 100 weight percent oxygen. Of course, non-stoichiometric spinel compounds having a variation to the 3:4 metal to oxygen ratio may also be used.

Figure 7:
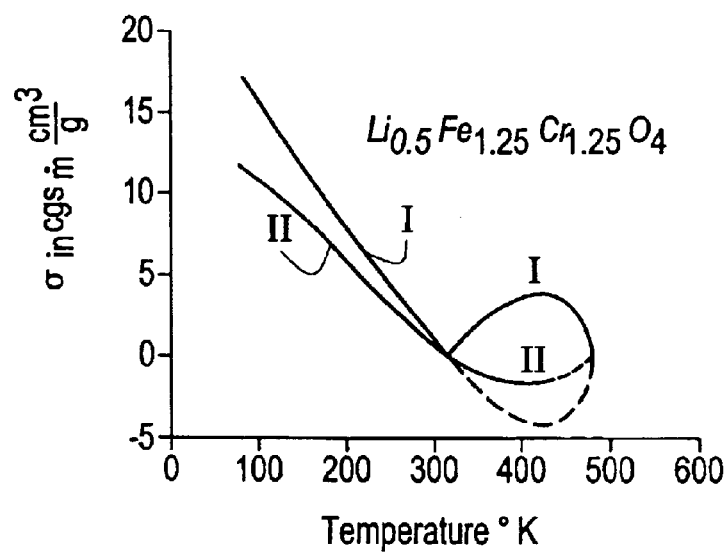
FIG. 7 shows the magnetization (curve I) and remanence (curve II) as a function of temperature for a spinel compound, $Li_{0.5}Cr_{1.25}Fe_{1.25}O_4$, in accordance with one embodiment of the invention.

The existence of $dM_s/dT>0$ behavior and/or compensation point among spinel compounds is relatively rare. An example of such spinel family is $Li_{0.5}Cr_aFe_{2.5-a}O_4$ wherein 'a' represents the atomic fraction of chromium. The compensation point behavior for this family extends over the range from 'a' equal to about 0.9 to 'a' equal to about 1.8. The variation in the magnetization with temperature for a compound with 'a' is equal to about 1.25 is shown in FIG. 7. $Li_{0.5}Cr_{1.25}Fe_{1.25}O_4$ has a compensation temperature of about 310 K where the magnetization vanishes. Beyond this temperature, the magnetization increases until about 410 K. Thus, this material has a positive rate of change of magnetization with temperature for about 100 K. At a temperature of about 480 K or the Curie temperature, the magnetization vanishes.

Another spinel family that exhibits ferrimagnetic behavior is $NiFe_{2-x}V_xO_4$ wherein x represents the atomic fraction of vanadium. At x equal to zero, the compound exhibits a behavior similar to that of a ferromagnetic material. For compounds comprising between about 0.6 and 0.69 atomic fraction of vanadium, the compensation point exists. The state where the magnetization is about zero at 0 K occurs in a compound with an atomic fraction of about 0.75.

In another aspect of the second embodiment, the shim material is a ceramic having a Rare Earth Iron Garnet (REIG) crystal which shows a positive change in magnetization with temperature. This crystal structure presents three different types of lattice sites for possible occupation by magnetic ions. One of these sites accepts large ions from the lanthanide rare earth series, which can have higher magnitude moments per ion but are weakly coupled to 3d transition metal magnetic ions on the other two sites. Thus, the REIG structure ferrimagnetic materials present numerous possibilities for compensation and inflection points.

Figure 8A:
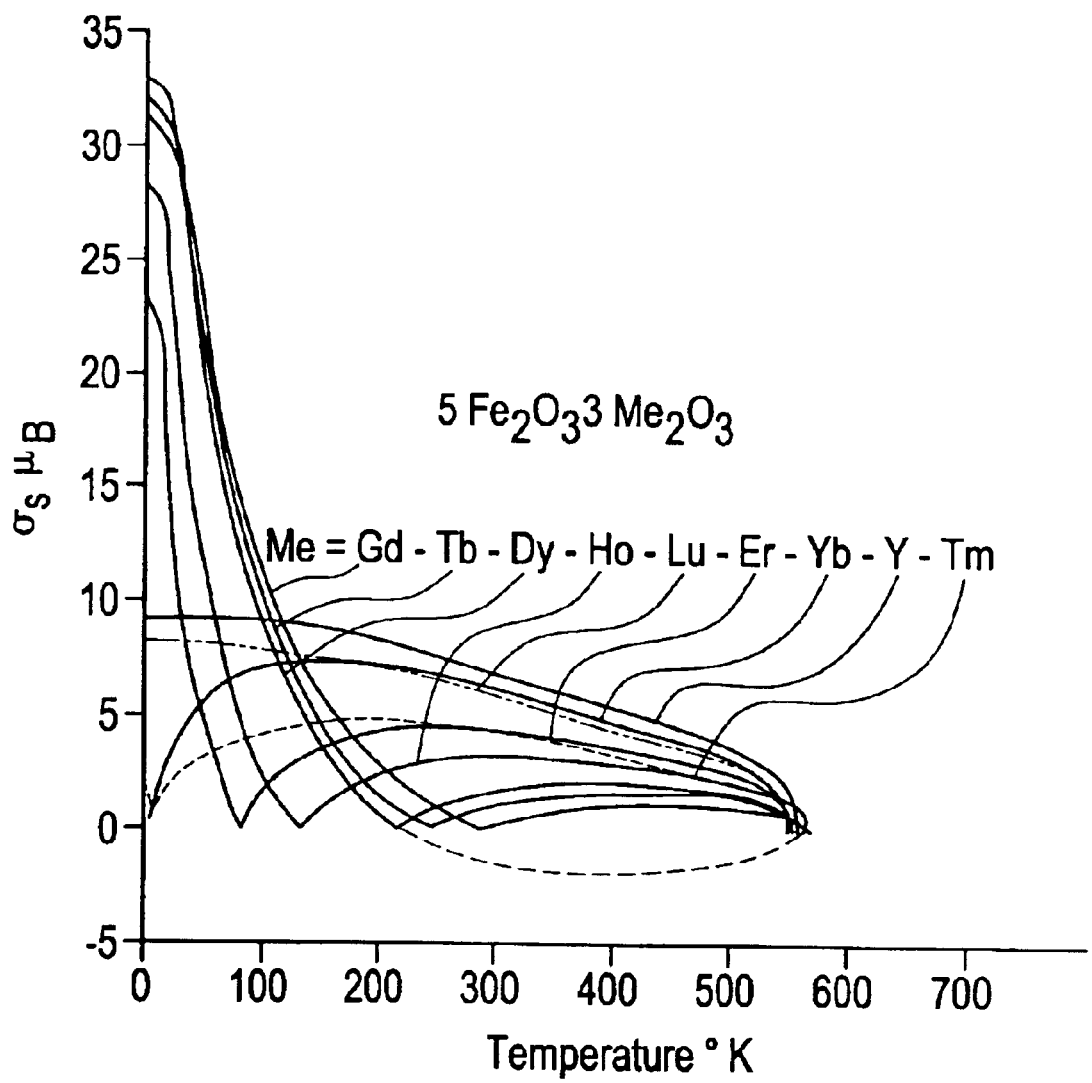
FIGS. 8A and 8B show the magnetization as a function of temperature for rare earth iron garnet materials in accordance with one embodiment of the invention.

FIG. 8A shows the variation of magnetization with temperature for a family of compounds based on the garnet crystal structure and represented by the formula $5(Fe_2O_3).3(R_2O_3)$, where R comprises 40 to 100 atomic percent of one or more rare earth series elements selected from Gd, Tb, Dy, Ho, Lu, Er, Yb, and Tm and M comprises 90 to 100 atomic percent Fe. R may also comprise Y or Bi in addition to the rare earth elements. From FIG. 8A, it can be seen that while the REIG crystal structure materials have a compensation point, a garnet crystal structure based on a Group III element, yttrium iron garnet, does not display a compensation temperature.

Other suitable garnet materials include $R_3M_5O_{12}$ materials, where R is a rare earth element and M is a transition metal, such as 90 to 100 atomic percent Fe. FIG.

8B shows the variation of magnetization with temperature for these garnet ceramics.

Figure 8B:
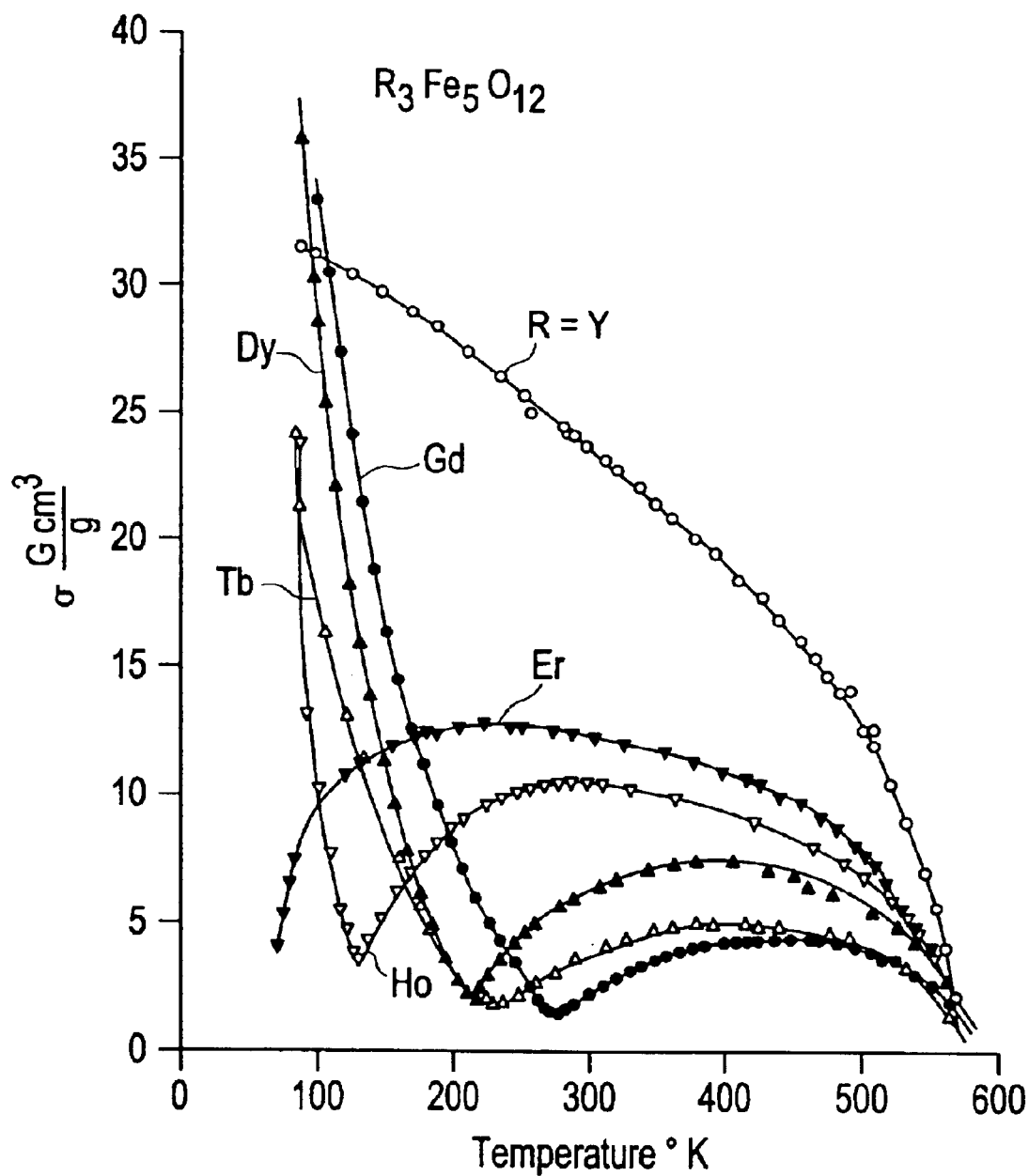

As seen in FIGS. 8A and 8B, the compensation temperature for compounds based on the REIG crystal structure covers a wide range. In MRI systems, the temperature of the shim element is estimated to range from at or near room temperature (about 298 K) to about 400 K. An example compound suitable for application in MRI systems is $Gd_3Fe_5O_{12}$. It should be noted that compounds based on the REIG crystal structure are also suitable for use in systems with an operating temperature that is higher or lower than the temperature range over which an MRI system is operated. For example, if the operating temperature of a system is between 150 K and 200 K, suitable materials are $Er_3Fe_5O_{12}$ or $Tm_3Fe_5O_{12}$. Similarly, if the operating temperature is between 350 K and 450 K, suitable materials are $Gd_3Fe_5O_{12}$ or $Tb_3Fe_5O_{12}$.

Figure 9:
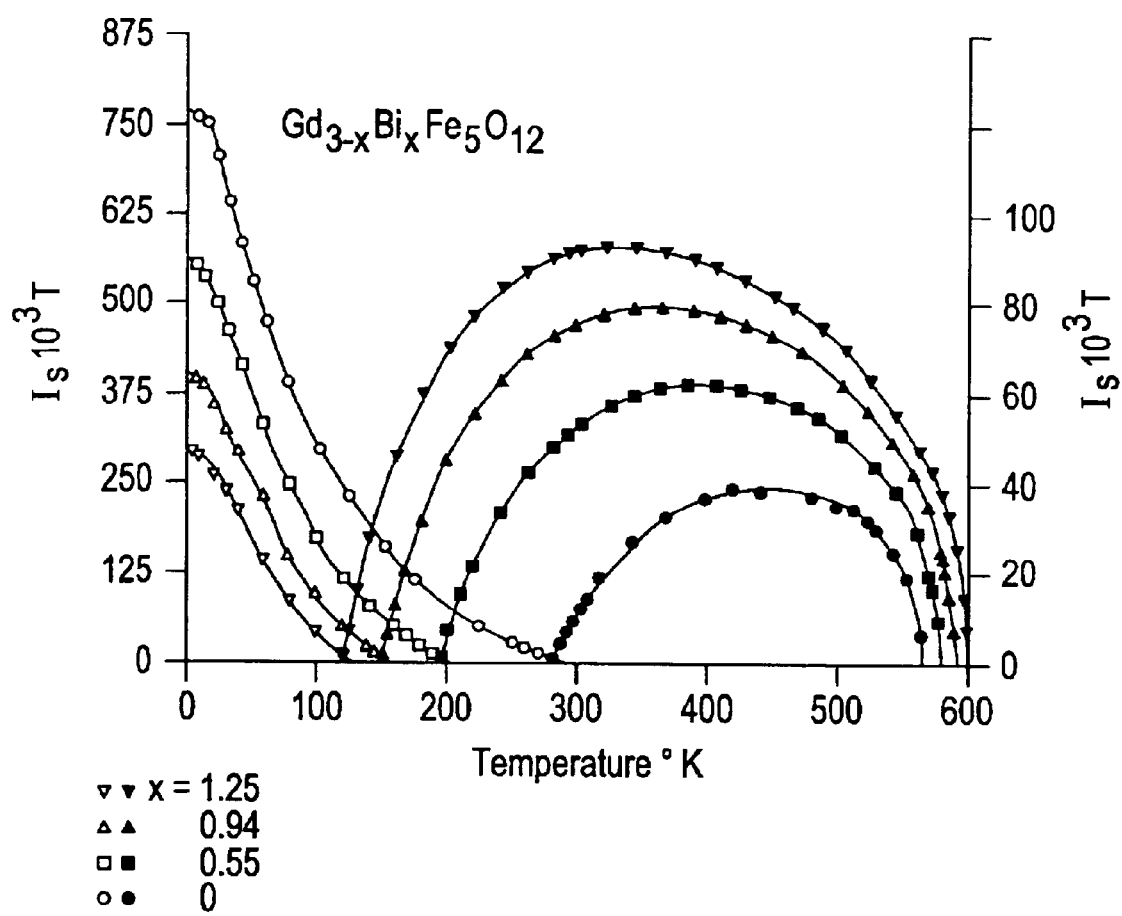
FIG. 9 shows the magnetization as a function of temperature for $Gd_{3-x}Bi_xFe_5O_{12}$ in accordance with one embodiment of the invention.

In the REIG crystal structure represented by the formula $R_3Fe_5O_{12}$, lattice sites occupied by R comprise a combination of rare earth lanthanide series and other suitable metallic elements such as Bi or Y. These metallic elements belong to the Group III, Group IV, Group V and Group VI elements of the periodic table of elements. Suitable elements are characterized by their valence and size. The valence of these elements is such that the resulting compound is valence balanced. The atomic or ionic size of suitable elements is such that the atoms or ions fit into the sublattices. The flexibility of material selection through design in the REIG family of compounds is shown in FIG. 9 for a family of compounds represented by the formula $Gd_{3-x}Bi_xFe_5O_{12}$. The compensation temperature for $Gd_3Fe_5O_{12}$ is about 290 K. Incorporating Bi in the material modifies the compensation temperature. For example, the compensation temperature is reduced to about 125 K for $Gd_{1.75}Bi_{1.25}Fe_5O_{12}$ as illustrated in FIG. 9.

A method for making a magnetic device comprises: (a) providing a ferromagnetic material; (b) providing a binder; (c) providing a ferrimagnetic material; and (d) forming the ferromagnetic material, the binder, and the ferrimagnetic material into a composite having a desired shape and dimension. The ferromagnetic material, binder, and ferrimagnetic material are formed into a composite using several techniques. One such technique is compaction to produce a composite of a desired shape. Suitable compaction techniques include uniaxial compaction, isostatic compaction, injection molding, extrusion, and hot isostatic pressing. In one embodiment of the invention, the composite is subjected to an annealing treatment. Annealing of the composite is performed in a tray oven, fluidized bed apparatus, a high temperature furnace or other known apparatus suitable for annealing.

As used herein, a shim comprises any material which is located in a magnetic field of a magnet, such as a permanent or superconductive magnet, and which is capable of affecting this magnetic field, such as by improving the homogeneity of the field. The shim of the embodiments of the present invention comprises a material which exhibits $dM_s/dT>0$ for a predetermined temperature range. The shim may be used in any device containing a magnet. For example, the shim may be used in an imaging system, such as an MRI (magnetic resonance imaging), NMR (nuclear magnetic resonance) and MRT (magnetic resonance therapy) system. Alternatively, the shim may be used in other devices containing a magnet, such as a motor or generator.

A shim element is an element containing the shim that is located separately from the magnet or magnets. As will be described in more detail below, a shim may also be integrated into a magnet or into another part of the device. The shim element may have any suitable shape and size for a given device and preferably comprises a ferrimagnetic material that is capable of exhibiting a positive change in magnetization with temperature.

In another embodiment of the invention, the shim element comprises more than one ferrimagnetic material. In another embodiment of the invention, the shim element has a composite structure comprising a ferrimagnetic material and a ferromagnetic material. In another embodiment of the invention, the shim element has a cladded structure comprising separate layers of ferrimagnetic material and ferromagnetic material. In another embodiment of the invention, the shim element has a stack structure comprising layers of ferrimagnetic material. In another embodiment of the invention, the shim element has a laminated structure comprising a ferrimagnetic material. In another embodiment of the invention, the shim element has a filament structure comprising a ferrimagnetic material. In another embodiment of the invention, the shim element has a wire structure comprising a ferrimagnetic material. In another embodiment of the invention, the shim element has a coil structure comprising a ferrimagnetic material. In another embodiment of the invention, the shim element has a strip structure comprising a ferrimagnetic material. In another embodiment of the invention, the shim element has a slab structure comprising a ferrimagnetic material. In another embodiment of the invention, the shim element has a foil structure comprising a ferrimagnetic material.

A method for altering a magnetic field of a magnet comprises disposing a shim element within the magnetic field. The shim element comprises a ferrimagnetic material. In one embodiment of the invention, the method comprises disposing a plurality of shim elements comprising a ferrimagnetic material. In another embodiment of the invention, the method comprises disposing a shim element comprising a ferromagnetic material and a ferrimagnetic material. In another embodiment of the invention, the method comprises disposing a plurality of shim elements comprising a ferromagnetic material and a ferrimagnetic material. In another embodiment of the invention, the method comprises disposing a plurality of shim elements comprising a ferromagnetic material and a plurality of shim elements comprising a ferrimagnetic material. In another embodiment of the invention, the method comprises disposing a plurality of shim elements comprising a ferromagnetic material, a plurality of shim elements comprising a ferrimagnetic material, and a plurality of shim elements comprising a ferromagnetic material and a ferrimagnetic material. The number, mass, and position of the shim elements are determined using known techniques.

A shim assembly capable of altering a magnetic field comprises at least one shim element. The shim element comprises a ferrimagnetic material. In one embodiment of the invention, the shim assembly comprises more than one ferromagnetic material and more than one ferrimagnetic material. In another embodiment of the invention, the ferromagnetic material and the ferrimagnetic material are adjacent to each other. The ferromagnetic material and ferrimagnetic material may be part of a composite structure, a cladded structure, a structure consisting of stacks of foils or strips, or a structure consisting of slabs. In another embodiment of the invention, the ferromagnetic material is separated from the ferrimagnetic material. Some of the shim holders may comprise shim elements comprising ferrimagnetic material while some other shim holders comprise shim elements comprising ferromagnetic material.

A magnetic resonance imaging system comprises a primary magnet and a shim assembly. The shim assembly comprises a ferromagnetic material and a ferrimagnetic material. The shim assembly is capable of altering a magnetic field generated by the primary magnet. Preferably such that a net magnetic field remains substantially constant. The principle of passive shimming is to arrange a distribution of shim elements in the shim assembly in such a way that the magnetic field produced by the shim elements is substantially equal in magnitude and opposite in sign to that of the inhomogeneous components of the magnetic field generated by the primary magnet. This results in a net magnetic field that remains substantially constant.

An MRI system in accordance with an aspect of the present invention comprises several assemblies. The MRI system comprises at least one superconducting magnet assembly which generates a primary magnetic field. The superconducting magnet assembly comprises several components, which may include superconducting magnet coils, a helium vessel to cool the superconducting magnet coils, inner and outer cold coils to reduce helium boil-off, and other structural and mechanical components. The MRI system may also include a primary gradient coil assembly which generates x, y, and z gradient fields used for MRI. The primary gradient coil assembly comprises structural, mechanical, and electrical components in addition to the coil. The MRI system also includes a radio frequency (RF) coil assembly which generates RF pulses into the imaging volume. If desired, an optional secondary gradient coil assembly may be used to shield the magnetic field generated by the primary gradient coil assembly. Furthermore, if desired, an optional active shimming coil assembly may also used for reducing inhomogeneities in the primary magnetic field. The MRI system also contains a shim assembly containing at least one shim element of the embodiments of the present invention.

Figure 10:
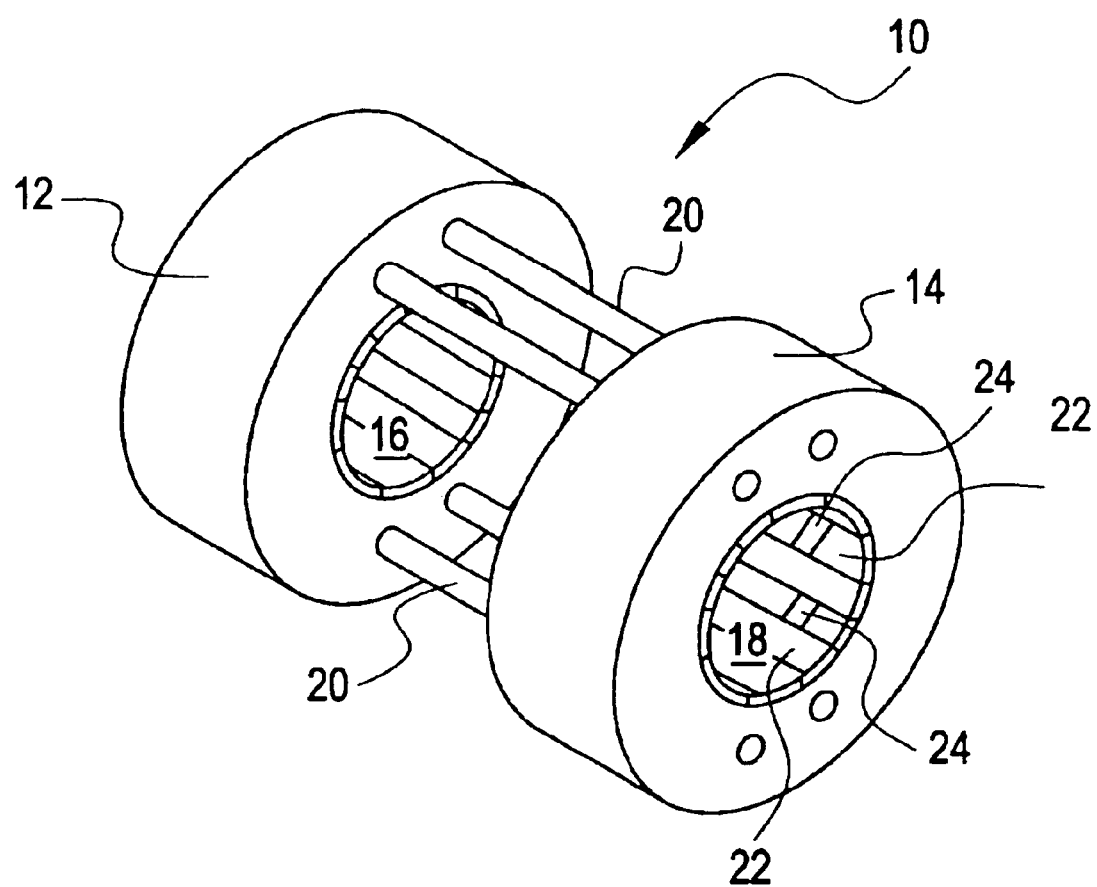
FIG. 10 is a perspective view of an embodiment of an MRI system in accordance with one aspect of the invention.

The MRI system may have any suitable layout. For example, as shown in FIG. 10, the MRI system 10 may comprise one or more superconducting magnet assemblies 12, 14 with generally co-axial bores 16 and 18. The assemblies 12, 14 are supported by posts 20. Each magnet assembly 12, 14 contains a superconductive coil which generates a magnetic field. Each assembly 12, 14 contains one or more shim assemblies which in this aspect of the invention comprises a movable shim drawer or tray 22 which holds passive shims 24. The shims 24 are arranged by thickness and/or locations in the drawers 22 to reduce the inhomogeneity of the primary magnetic field generated by the magnet assemblies 12, 14 to within predetermined specifications.

Figure 11:
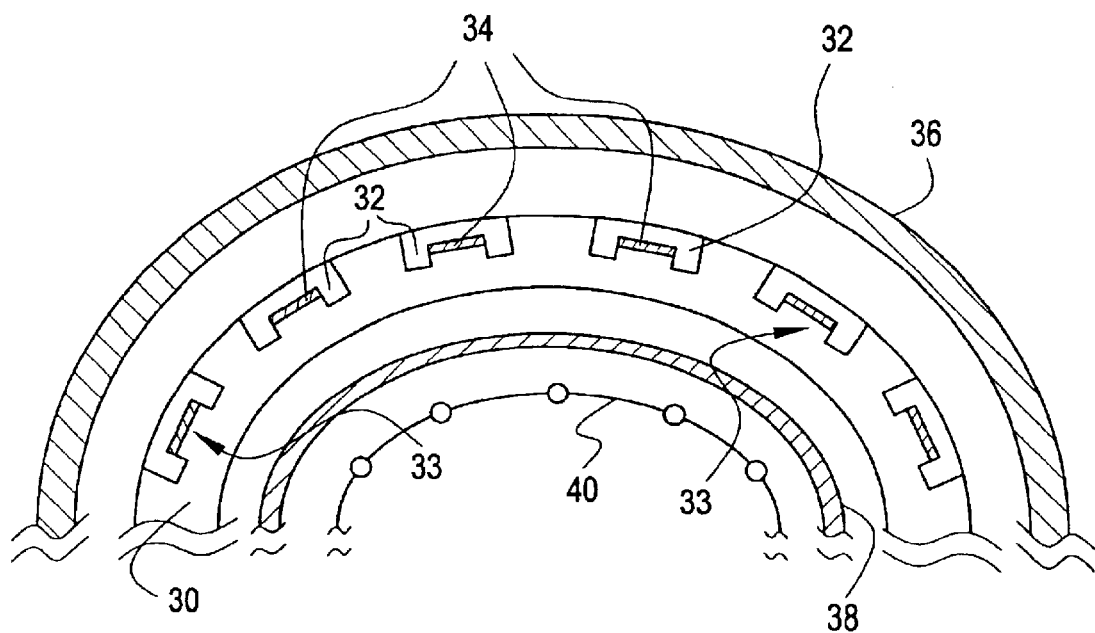
FIG. 11 is front a cross-sectional view illustrating schematically an RF coil assembly, a gradient coil assembly, a shim assembly, and a superconducting magnet assembly of an embodiment of an MRI system in accordance with one aspect of the invention.

In an alternative embodiment shown in FIG. 11, the shim assembly 30 comprises at least one shim holder 32 containing one or more shim elements 34. For a cylindrical MRI configuration, the shim assembly 30 may be located between a superconducting magnet assembly 36 and the gradient coil assembly 38. The RF coil assembly 40 is located radially inward of the gradient coil assembly 38. The shim holder may comprise elongated dielectric members 32 extending in the axial direction of the bore of the MRI system. The members 32 may be attached to inner or outer walls of suitable structural cylindrical members of the MRI system. Each member 32 contains a pocket 33. The shims 34 may comprise plate or sheet shaped pieces secured in the pockets 33.

Figure 12:
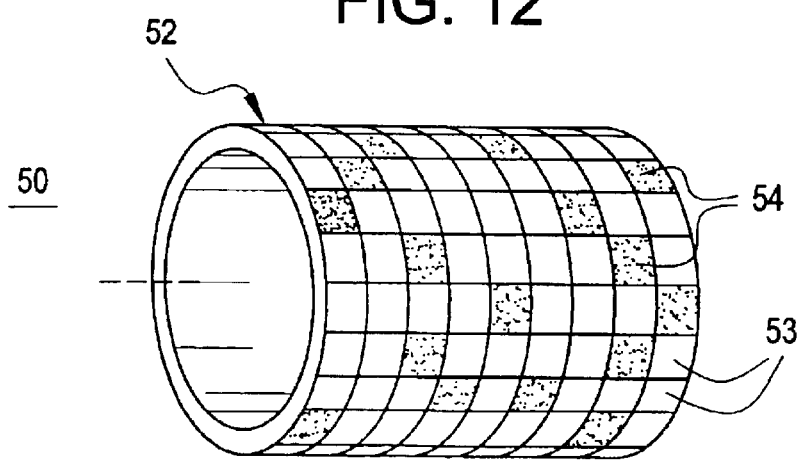
FIG. 12 is a perspective view of a shim assembly in accordance with another aspect of the invention.

In an alternative embodiment shown in FIG. 12, the shim assembly 50 comprises tubular member 52 made of a dielectric material. Pockets 53 are arranged on inner or outer sidewalls of the tubular member 52. The shims 54 are placed in desired pockets 53 of the tubular member 52. The tubular member 52 may also be arranged between a gradient coil and the superconductive coil.

While superconducting MRI systems have been described above, the shim materials of the preferred embodiments of the present invention may also be used in permanent magnet MRI systems. In permanent magnet MRI systems, the superconducting coil is replaced by two or more permanent magnets, such as rare earth-iron-boron permanent magnets, which provide the primary magnetic field to an imaging volume located between the magnets. The permanent magnet MRI system may have a closed tubular or cylindrical configuration, or an open configuration. For example, the permanent magnets may be supported on yoke, such as a "C" shaped yoke. The shims are located between the imaging volume and the permanent magnets and reduce the inhomogeneity in the primary magnetic field.

Any suitable permanent magnet materials may be used with the shims of the preferred embodiment of the present invention. Preferably the magnets comprise rare earth-transition metal-boron magnets. The rare earth element preferably comprises Nd and/or Pr and optionally Ce. The transition metal preferably comprises 80–100% by weight of Fe with 0–20% of Co or other transition metals. These permanent magnets are very sensitive to temperature fluctuations. For example, the temperature coefficient of magnetic field for NdFeB is about −0.12%/K. A change in the temperature of only about 0.1 K causes a change of about 120 parts per million in the magnetic field. Because of such high temperature sensitivity, the shims of the preferred embodiments of the present invention compensate for the change in the magnetic field of the permanent magnet with increasing temperature.

While the shims described above are located separately from superconducting or permanent magnets, the shims of the preferred embodiments may be incorporated into the magnet itself. For example, for a permanent magnet that comprises a permanent magnet powder held together by a binder (i.e., a so-called bonded permanent magnet), the shim materials of the preferred embodiments of the present invention may be in the form of a powder that is mixed in with the binder and the permanent magnet material. The shim material powder may be dispersed homogeneously with the magnet powder in the binder. Alternatively, the shim material powder may be selectively located only in the specific location(s) of the bonded magnet to compensate for predetermined inhomogeneities in the magnetic field of the bonded magnet. If desired, the shim material may comprise shim chunks rather than fine powder which are located in the bonded magnet. While less preferred, the shim material in solid, powder or chunk form may also be mixed in with bonded superconductive tape or located in the sheath surrounding the superconductive tape which comprises the superconductive magnet. Thus, the negative rate of change of magnetization with temperature for the permanent or superconductive magnet material is offset by the positive rate of magnetization for the shim material when the temperature of the magnet is in the range of temperature at which the magnetization of the shim material increases. Thus, the term "shim" is used in the broadest possible sense herein and includes shimming materials located separately from the magnet material or incorporated into the magnet material.

EXAMPLE

Magnetic and physical properties for various commercially available ferromagnetic materials and a laboratory prepared ferrimagnetic material were measured. The ferromagnetic materials considered were commercially available Fe (Ancorsteel 300SC) powder, iron-cobalt-vanadium alloy (about 2 weight percent V, about 49 weight percent Fe, and about 49 weight percent Co, known commercially as 2V-Permendur or Vacoflux-50, depending on the manufacturer), and an iron-cobalt alloy (about 50 weight percent Fe and about 50 weight percent Co). The ferrimagnetic materials, $Dy_2Co_{17}$ and $ErFe_3$, were prepared by arc melting in purified argon gas. Table 2 lists the measured values of the magnetic properties along with physical properties obtained from available literature.

The intrinsic magnetization ($B_i$) at a magnetic field of about 1.5 Tesla is shown in Table 3 for the various materials. The value of about 24000 Gauss for the Fe—Co alloy was taken from literature. The change in magnetization at a magnetic field of about 1.5 Tesla over about 40 K change in temperature is represented by $\Delta(B_i)$. As can be seen, the value for the ferromagnetic materials is negative while that for $Dy_2Co_{17}$ and $ErFe_3$ is about +525 and +509 Gauss respectively. The estimated error in the change in magnetization is estimated to be about +/−15 Gauss. The ferromagnetic materials show a loss in magnetization ranging from about 0.57% for the Fe—Co alloy to about 0.84% for the Fe powder. On the other hand, the ferrimagnetic material, $ErFe_3$, shows a gain in magnetization of 38% under the same conditions.

TABLE 3

| Property | Fe (300SC) | Fe—Co—V alloy | Fe—Co alloy | $Dy_2Co_{17}$ | $ErFe_3$ |
|---|---|---|---|---|---|
| $B_i$ @ 1.5 T, Gauss | 21320 | 23000 | 24000 | 6850 | 1324 |
| Density, gm/cm³ | 7.86 | 7.97 | 8.16 | 9.03 | 9.13 |
| σ @ 1.5 T, emu/gm | 216 | 229.5 | 234 | ≈60.37 | 11.54 |
| $\Delta(B_i)$ @ 1.5 T and 40 K temperature increase, Gauss | −180 | −136 | −136 (estimate) | +525 | +509 |
| $\Delta(B_i)/B_i$, % | −0.84 | −0.59 | −0.57 | 7.7 | 38 |

Calculated values for parameters of a composite material comprising a ferromagnetic material and a ferrimagnetic material are shown in Table 4.

The estimated magnetization for the composite materials comprising a ferromagnetic material, a ferrimagnetic material, and a binder are shown for various binder concentrations in Table 4. The calculated volume and weight fractions of exemplary ferromagnetic materials in a composite that is expected to have a rate of change of magnetization with temperature of about zero in shown in Table 4. For the composite with Fe (300SC) powder, the volume fraction of $ErFe_3$ in the composite is estimated to be about 0.26 and the weight fraction of $ErFe_3$ in the composite is estimated to be about 0.29. For the composite with the Fe (300SC) powder, the estimated magnetization at a magnetic field of about 1.5 Tesla ranges from about 8050 Gauss for a composite with about 50 weight percent binder to about 16101 Gauss for a composite with no binder. The estimated magnetization for a composite of Fe (300SC), $ErFe_3$ and about 15 volume percent binder is about 25 percent lower than that for Fe (300SC) and about 15 volume percent binder. The estimated magnetization for a composite of Fe—Co alloy, $ErFe_3$ and about 15 volume percent binder is only about 10% lower than that for Fe (300SC) and about 15 volume percent binder (about 16333 Gauss versus about 18122 Gauss).

TABLE 4

| | $ErFe_3$ Composites | | | $Dy_2Co_{17}$ Composites | | |
|---|---|---|---|---|---|---|
| | Fe (300SC) | 2V49Fe 49Co | 50Fe 50Co | Fe | 2V49Fe 49Co | 50Fe50Co |
| Volume fraction of rare earth alloy | 0.261 | 0.211 | 0.211 | 0.255 | 0.206 | 0.206 |
| Volume fraction of ferromagnetic material | 0.739 | 0.789 | 0.789 | 0.745 | 0.794 | 0.794 |
| Weight fraction of rare earth alloy | 0.291 | 0.235 | 0.230 | 0.283 | 0.227 | 0.223 |
| Weight fraction of ferromagnetic material | 0.709 | 0.765 | 0.770 | 0.717 | 0.773 | 0.777 |
| Bi @ 1.5 T, no binder | 16101 G | 18420 G | 19215 G | 17630 G | 19558 G | 20467 G |
| volume fraction of metal in composite = 0.5; Bi (composite) | 8050 G | 9210 G | 9608 G | 8815 G | 9779 G | 10234 G |
| volume fraction of metal in composite = 0.6; Bi (composite) | 9660 G | 11052 G | 11529 G | 10578 G | 11735 G | 12280 G |
| volume fraction of metal in composite = 0.7; Bi (composite) | 11271 G | 12894 G | 13451 G | 12341 G | 13691 G | 14327 G |
| volume fraction of metal in composite = 0.8; Bi (composite) | 12881 G | 14736 G | 15372 G | 14104 G | 15646 G | 16374 G |
| volume fraction of metal in composite = 0.85; Bi (composite) | 13686 G | 15657 G | 16333 G | 14986 G | 16624 G | 17397 G |
| σ @ 1.5 T, emu/gm; no binder | 156.5 | 177.9 | 182.8 | 172.0 | 190.7 | 195.3 |

For the ferromagnetic-ferrimagnetic composite shim, the volume or weight fractions of each material are preferably selected such that the change of magnetization with temperature is about zero in a significant portion of, such as a 25 to 50 degree range—or even the entire predetermined temperature range in which the ferrimagnetic material exhibits $dM_s/dT>0$. In other words, the magnetization loss in the ferromagnetic material with temperature is offset by the magnetization gain in the ferrimagnetic material. Thus, to determine the shim composition, the change in magnetization of the desired ferrimagnetic and ferromagnetic material with temperature in the desired temperature range is determined. Then the volume or weight fractions of each material in the composite shim are selected to bring the change in magnetization of the composite shim with temperature in the desired temperature range as close as possible to zero.

The ferrimagnetic material is preferably selected such that its rate of change of magnetization with temperature is several times greater than that of the ferromagnetic material. Thus, the shim preferably contains more ferromagnetic than ferrimagnetic material, such as 10–35, preferably 20–25 volume percent ferrimagnetic material and 65–90, preferably 75–80 volume percent ferromagnetic material. The examples shown in Table 4 illustrate exemplary volume and weight fractions of three ferromagnetic and two ferrimagnetic materials such that the magnetization change of the composite shim with temperature for the temperature range of about 298K to about 338K is about zero. Table 4 also illustrates various compositions with different volume fractions of metal (i.e., ferrimagnetic and ferromagnetic material) compared to the volume fraction of the binder in the composite shim. It should be noted that the ferrimagnetic and ferromagnetic materials may be provided into a composite shim without using a binder.

In another preferred embodiment of the present invention, soft iron is used as the ferromagnetic material. Soft iron powder is advantageous because it is more compressible than hard iron. Thus, a composite shim may have a higher metal to binder ratio than a composite shim with a hard iron ferromagnetic material. The higher metal to binder ratio leads to a higher magnetization. For example, for a solid, hard iron shim, the magnetization is expected to be about 21320 Gauss from Table 3. For a composite shim containing the hard iron powder and the $Dy_2Co_{17}$ ferrimagnetic material without a binder, the magnetization is expected to be about 17630 Gauss from Table 4. If the FeCo alloy is used instead of the hard iron, the magnetization is expected to be about 20467 Gauss from Table 4. However, if these materials are loaded into a binder at a volume fraction of about 0.6 to 0.65 percent, then the magnetization is expected to be about 13.8+/−0.5, 11.02+/−0.4 and 12.8+/−0.5 kiloGauss, respectively, from Tables 3 and 4. In contrast, if soft iron is used instead of the hard iron or the FeCo alloy as the ferromagnetic material, then the metal volume fraction in shim may be increased without significantly increasing processing cost. For example, the metal volume fraction in the shim may be increased to 0.8 to 0.85 percent without significantly increasing processing cost. In this case, for a metal fraction of about 0.8 to 0.85 (and binder fraction of about 0.15 to 0.2) the magnetization is expected to be about 14.5+/−0.4 kiloGauss, which is higher than all three values of magnetization for the 0.6 to 0.65 metal fraction containing hard iron or FeCo alloy.

The composite shim is preferably used in a superconductive or permanent magnet MRI. However, the ferrimagnetic or composite ferromagnetic-ferrimagnetic shim may be used in other devices, such as motors or generators which contain a rotor and a stator. In motors or generators, the shim may have any suitable shape. Preferably, the shim dimensions are selected to bring the change in magnetization of the generator or motor magnet with temperature in the desired temperature range as close as possible to zero. For example, the shim may be incorporated into the magnet yoke or other motor or generator element, such as the rotor and/or stator, which is located in the magnetic field of the magnet.

In another aspect of the invention, the shim may be used as a temperature compensating element in a measuring, indicating and/or recording device which utilizes magnetic fields or fluxes. For example, these devices include watt-hour meters, induction meters, thermometers, and relays, as described for example in U.S. Pat. Nos. 1,724,405; 2,213,085; 2,98,548; and 4,456,898, incorporated herein by reference in their entirety. For example, the shim may be located adjacent to a side of a permanent magnet of a watt-hour meter, such as the watt-meter device described in U.S. Pat. No. 4,456,898. This device includes an aluminum disc rotating between poles of opposing permanent magnets.

While specific preferred embodiments of the present invention have been disclosed in the foregoing, it will be appreciated by those skilled in the art that many modifications, substitutions, or variations may be made thereto without departing from the spirit and scope of the invention as defined in the appended claims.

What is claimed is:

1. A shim adapted for altering a magnetic field of a magnet, the shim comprising a first material which exhibits an increase in spontaneous magnetization with an increase in temperature for a predetermined temperature range.

2. The shim of claim 1, wherein the first material comprises a ferrimagnetic material.

3. The shim of claim 2, wherein said ferrimagnetic material comprises an intermetallic compound represented by the formula $R_aM_b$ wherein R is selected from the group consisting of rare-earth elements and M is selected from the group consisting of 3d transition elements, and a and b are numbers.

4. The shim of claim 3, wherein the intermetallic compound comprises $R_2M_{17}$, where R comprises at least 90 atomic percent of a rare earth element selected from at least one of Dy, Sm, Tm, Er, Ho, Tb and Gd, and M comprises at least 90 atomic percent Co.

5. The shim of claim 4, wherein the intermetallic compound comprises $Dy_2Co_{17}$.

6. The shim of claim 3, wherein the intermetallic compound comprises $RM_2$, where R comprises at least 90 atomic percent of Er or Tm, and M comprises at least 90 atomic percent Fe.

7. The shim of claim 6, wherein the intermetallic compound comprises $TmFe_2$.

8. The shim of claim 3, wherein the intermetallic compound comprises $RM_2$, where R comprises at least 90 atomic percent of Er, Ho or Gd, and M comprises at least 90 atomic percent Fe.

9. The shim of claim 8, wherein the intermetallic compound comprises $ErFe_3$.

10. The shim of claim 3, the intermetallic compound comprises $RM_{5+x}$ or $R_6M_{23}$.

11. The shim of claim 3, wherein M consists essentially of Co or Fe.

12. The shim of claim 11, wherein R comprises two or more rare earth elements.

13. The shim of claim 12, wherein intermetallic compound comprises $Gd_{1-x}Th_xFe_3$, where x is greater than zero and less than one.

14. The shim of claim 1, wherein said first material comprises a spinel compound having a formula $(A,D)_3E_4$, where A and D comprise at least two different metal elements and E consists essentially of oxygen.

15. The shim of claim 14, wherein the spinel compound comprises $Li_{0.5}Cr_aFe_{2.5-a}O_4$, where a ranges from 0.9 to 1.8, or $NiFe_{2-x}V_xO_4$, where x ranges from 0.6 to 0.69.

16. The shim of claim 1, wherein said first material comprises a garnet crystal structure represented by the formula $R_3M_5O_{12}$ wherein R comprises 40 to 100 atomic percent of at least one element selected from the group consisting of Gd, Tb, Dy, Ho, Lu, Er, Yb, and Tm, and M comprises 90 to 100 atomic percent of Fe.

17. The shim of claim 16, wherein the first material is selected from $Gd_3Fe_5O_{12}$, $(Gd, Bi)_3Fe_5O_{12}$, $Tb_3Fe_5O_{12}$, $Tm_3Fe_5O_{12}$ and $Er_3Fe_5O_{12}$.

18. The shim of claim 1, wherein said shim comprises a composite shim comprising said first material and a ferromagnetic material.

19. The shim of claim 18, wherein the composite shim comprises first material powder and ferromagnetic material powder contained in a binder.

20. The shim of claim 19, wherein the ferromagnetic material comprises iron or a cobalt iron alloy.

21. The shim of claim 19, wherein:

the ferromagnetic material comprises soft iron; and the composite shim comprises at least 80 volume percent of ferromagnetic material powder and first material powder and 20 volume percent or less binder.

22. The shim of claim 18, wherein the ratio of the first material to the ferromagnetic material in the composite shim is selected such that the first material compensates a loss of magnetization in the ferromagnetic material with an increasing temperature.

23. The shim of claim 22, wherein:

the predetermined temperature range includes at least a range of 298 K to 400K; and the composite shim exhibits substantially no change in spontaneous magnetization with at least a 25 degree K increase in temperature in a predetermined temperature range.

24. The shim of claim 1, wherein the shim is located in a shim element.

25. The shim of claim 24, wherein the shim element having a structure selected from the group consisting of composite, cladded, laminated, filament, wire, coil, strip, foil, slab, and stack.

26. An imaging system, comprising:

a magnet; and the shim element of claim 25 located between the magnet and an imaging volume of the imaging system.

27. The system of claim 26, wherein:

the system comprises an MRI system; and the magnet comprises a superconductive or permanent magnet.

28. An indicating, recording or measuring device comprising a magnet and the shim of claim 1 located adjacent to the magnet.

29. A motor or generator, comprising:

a rotor;

a stator;

a magnet located in one of the rotor and stator; and the shim of claim 1 located in the magnetic field of the magnet.

30. A method for altering a magnetic field of a magnet, said method comprising disposing a shim within said magnetic field, wherein the shim comprises a first material which exhibits an increase in spontaneous magnetization with an increase in temperature for a predetermined temperature range.

31. The method of claim 30, wherein the first material comprises a ferrimagnetic material.

32. The method of claim 31, wherein said ferrimagnetic material comprises an intermetallic compound represented by the formula $R_aM_b$ wherein R is selected from the group consisting of rare-earth elements and M is selected from the group consisting of 3d transition elements, and a and b are numbers.

33. The method claim 32, wherein the intermetallic compound comprises $R_2M_{17}$, where R comprises at least 90 atomic percent of a rare earth element selected from at least one of Dy, Sm, Tm, Er, Ho, Th and Gd, and M comprises at least 90 atomic percent Co.

34. The method of claim 33, wherein the intermetallic compound comprises $Dy_2Co_{17}$.

35. The method of claim 30, wherein said shim comprises a composite shim comprising said first material and a ferromagnetic material.

36. The method of claim 35, wherein the predetermined temperature range includes at least a range of 298 K to 400K.

37. The method of claim 36, further comprising increasing the temperature of the composite shim within the predetermined temperature range while the composite shim exhibits substantially no change in spontaneous magnetization with an increase in temperature in the predetermined temperature range.

38. The method of claim 35, wherein the shim is located in a magnetic resonance imaging system.

39. The method of claim 30, wherein the shim is located in a permanent magnet of a magnetic resonance imaging system.

40. The method of claim 39, wherein the magnetic field of the permanent magnet exhibits substantially no change with an increase in temperature from 298K to 338K.

* * * * *